(12) United States Patent
Yu

(10) Patent No.: US 12,347,601 B2
(45) Date of Patent: Jul. 1, 2025

(54) PLANAR TRANSFORMER, POWER CONVERSION CIRCUIT, AND ADAPTER

(71) Applicant: HUAWEI TECHNOLOGIES CO., LTD., Guangdong (CN)

(72) Inventor: Peng Yu, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 786 days.

(21) Appl. No.: 17/550,188

(22) Filed: Dec. 14, 2021

(65) Prior Publication Data

US 2022/0102057 A1    Mar. 31, 2022

Related U.S. Application Data

(63) Continuation of application No. PCT/CN2020/083477, filed on Apr. 7, 2020.

(30) Foreign Application Priority Data

Jun. 14, 2019   (CN) .......................... 201910518152.3

(51) Int. Cl.
*H01F 27/29*   (2006.01)
*H01F 27/28*   (2006.01)
(Continued)

(52) U.S. Cl.
CPC ......... *H01F 27/2804* (2013.01); *H01F 27/29* (2013.01); *H01F 27/36* (2013.01);
(Continued)

(58) Field of Classification Search
CPC ...... H01F 27/2804; H01F 27/29; H01F 27/36; H01F 27/38; H01F 2027/2809;
(Continued)

(56) References Cited

U.S. PATENT DOCUMENTS

2007/0171585 A1   7/2007 Sicong et al.
2013/0242452 A1   9/2013 Park
(Continued)

FOREIGN PATENT DOCUMENTS

CN   101114541 A   1/2008
CN   201622921 U   11/2010
(Continued)

OTHER PUBLICATIONS

Extended European Search Report dated Jul. 15, 2022 issued for European Application No. 20822966.6 (12 pages).
(Continued)

*Primary Examiner* — Tuyen T Nguyen

(57) ABSTRACT

A planar transformer, a power conversion circuit, and an adapter, is provided to improve noise suppression performance. The planar transformer includes a magnetic core and a printed circuit board (PCB) winding board, where the PCB winding board includes a primary winding, a secondary winding, a shielding winding, and a compensation winding. In embodiments of this disclosure, the shielding winding and the compensation winding that has a plurality of turns of coils are disposed between the primary winding and the secondary winding of the planar transformer. The shielding winding can shield electric field coupling between the primary winding and the secondary winding, thereby suppressing a noise current between the primary winding and the secondary winding. Common mode noise generated by the compensation winding cancels common mode noise flowing to the secondary winding or the primary winding, to minimize common mode noise of an entire system.

17 Claims, 12 Drawing Sheets

(51) Int. Cl.
*H01F 27/36* (2006.01)
*H01F 27/38* (2006.01)
*H02M 1/44* (2007.01)
*H02M 3/335* (2006.01)
*H05K 1/16* (2006.01)

(52) U.S. Cl.
CPC .............. *H01F 27/38* (2013.01); *H02M 1/44* (2013.01); *H02M 3/33576* (2013.01); *H05K 1/165* (2013.01); *H01F 2027/2809* (2013.01); *H01F 2027/2819* (2013.01)

(58) Field of Classification Search
CPC ............... H01F 2027/2819; H01F 27/289; H02M 1/44; H02M 3/33576; H02M 3/33507; H05K 1/165; H05K 2201/086
See application file for complete search history.

(56) References Cited

U.S. PATENT DOCUMENTS

| | | | |
|---|---|---|---|
| 2014/0347159 A1* | 11/2014 | Zuo | H01F 27/24 336/84 C |
| 2016/0134195 A1 | 5/2016 | Song et al. | |

FOREIGN PATENT DOCUMENTS

| | | |
|---|---|---|
| CN | 202013796 U | 10/2011 |
| CN | 203013469 U | 6/2013 |
| CN | 103310956 A | 9/2013 |
| CN | 103700484 A | 4/2014 |
| CN | 104183373 A | 12/2014 |
| CN | 204651134 U | 9/2015 |
| CN | 105405606 A | 3/2016 |
| CN | 105609300 A | 5/2016 |
| CN | 105047385 B | 6/2017 |
| CN | 105099205 B | 12/2017 |
| CN | 107993814 A | 5/2018 |
| CN | 108122667 A | 6/2018 |
| CN | 108183019 A | 6/2018 |
| CN | 108364768 A * | 8/2018 ......... H01F 27/2804 |
| CN | 110310815 A | 10/2019 |
| EP | 3576113 A1 | 12/2019 |
| JP | H04152609 A | 5/1992 |
| JP | 2015133440 A | 7/2015 |
| WO | 2019091393 A1 | 5/2019 |
| WO | 2019096892 A1 | 5/2019 |

OTHER PUBLICATIONS

L. Xie, X. Ruan, Q. Ji and Z. Ye, "Shielding-Cancelation Technique for Suppressing Common-Mode EMI in Isolated Power Converters," in IEEE Transactions on Industrial Electronics, vol. 62, No. 5, pp. 2814-2822, May 2015, doi: 10.1109/TIE.2014.2365154, 9 pages.

Office Action issued in CN2019105181523, dated Jan. 29, 2021, 6 pages.

International Search Report and Written Opinion issued in PCT/CN2020/083477, dated Jul. 15, 2020, 10 pages.

* cited by examiner

PLANAR TRANSFORMER, POWER CONVERSION CIRCUIT, AND ADAPTER

CROSS-REFERENCE TO RELATED APPLICATIONS

This application is a continuation of International Application No. PCT/CN2020/083477, filed on Apr. 7, 2020, which claims priority to Chinese Patent Application No. 201910518152.3, filed on Jun. 14, 2019. The disclosures of the aforementioned applications are hereby incorporated by reference in their entireties.

TECHNICAL FIELD

This disclosure relates to the circuit field, and more specifically, to a planar transformer, a voltage conversion circuit, and an adapter.

BACKGROUND

A switch-mode power supply has been rapidly developed due to its advantages of high efficiency, a small size, and good output stability. However, a problem of noise interference received by the switch-mode power supply during operation is quite prominent. Noise applied to the switch-mode power supply includes external noise, noise caused by switch-off and switch-on of a switch component of the switch-mode power supply, noise caused by reverse recovery of a rectifier diode, and noise caused by a capacitor, an inductor, or a wire in a circuit of the switch-mode power supply. These noise signals are conducted and radiated to an electric device along a circuit network, and lead to electromagnetic interference (EMI) on the electric device. Therefore, the switch-mode power supply has quite a strict requirement for noise suppression.

The noise applied to the switch-mode power supply includes common mode noise, and the common mode noise mainly includes noise, flowing to a reference ground, caused due to a mutual effect between parameters of the circuit of the switch-mode power supply. How to reduce or even eliminate the common mode noise of the switch-mode power supply is an issue of great concern in the industry.

SUMMARY

This disclosure provides a planar transformer, a power conversion circuit, and an adapter, to improve noise suppression performance.

According to a first aspect, a planar transformer is provided, including a magnetic core and a printed circuit board (PCB) winding board, where the PCB winding board includes:

a primary winding, where a first terminal of the primary winding is connected to an electric potential quiescent point of a primary circuit of a power conversion circuit, and a first turn of coil of the primary winding is disposed at a start position of the first terminal of the primary winding;

a secondary winding, where a first terminal of the secondary winding is connected to an electric potential quiescent point of a secondary circuit of the power conversion circuit, and a first turn of coil of the secondary winding is disposed at a start position of the first terminal of the secondary winding;

a shielding winding, disposed between the primary winding and the secondary winding, and configured to shield electric field coupling between the primary winding and the secondary winding; and a compensation winding, adjacent to the primary winding or adjacent to the secondary winding, where the compensation winding includes N turns of coils, and N is a positive number greater than 1.

In this embodiment of this disclosure, the shielding winding and the compensation winding that has a plurality of turns of coils are disposed between the primary winding and the secondary winding of the planar transformer. The shielding winding can shield the electric field coupling between the primary winding and the secondary winding, thereby suppressing a noise current between the primary winding and the secondary winding. Common mode noise generated by the compensation winding cancels common mode noise flowing to the secondary winding or the primary winding, to minimize common mode noise of an entire system. In this embodiment of this disclosure, because the shielding winding can reduce the noise current between the primary winding and the secondary winding, a total quantity of turns of the compensation winding can be reduced. Based on this, a quantity of turns of coils of the compensation winding that are required in this embodiment of this disclosure is reduced, thereby facilitating improvement of design and mass production consistency of the PCB winding board.

Further, because the common mode noise can be fully suppressed in this embodiment of this disclosure, conducted emission (CE) can be effectively reduced in this embodiment of this disclosure, thereby reducing an input common mode inductance. In addition, for a high frequency band (for example, above 30 MHz), an electromagnetic shielding technology is used in this embodiment of this disclosure, so that impact of frequency coupling of the secondary winding on the primary winding can be reduced, thereby reducing radiated emission (RE).

In addition, in this embodiment of this disclosure, the common mode noise can be fully suppressed, and the CE and the RE can be effectively reduced. Therefore, the power conversion circuit in this embodiment of this disclosure can reduce a value of a Y capacitor bridged between the primary circuit and the secondary circuit or even cancel the Y capacitor, so that a higher-safety power conversion circuit having a Y capacitor with a small capacitance value or even having no Y capacitor can be provided, and costs and a size of the power conversion circuit can be reduced.

In this embodiment of this disclosure, that the shielding winding can shield the electric field coupling between the primary winding and the secondary winding includes the following two cases.

In a first case, when a first terminal of the shielding winding is connected to the electric potential quiescent point of the primary circuit, the shielding winding can shield coupling of an electric field of the primary winding to the secondary winding. In this case, the shielding winding may be disposed close to the secondary winding, that is, adjacent to the secondary winding.

In a second case, when a first terminal of the shielding winding is connected to the electric potential quiescent point of the secondary circuit, the shielding winding can shield coupling of an electric field of the secondary winding to the primary winding. In this case, the shielding winding may be disposed close to the primary winding, that is, adjacent to the primary winding.

For example, that the shielding winding is configured to shield the coupling of the electric field of the primary winding to the secondary winding means that the shielding winding can shield a noise current coupled from the primary winding to the secondary winding. For example, the shielding winding can shield a noise current coupled directly from the primary winding to the secondary winding, or shield a noise current coupled from the primary winding to the secondary winding through an inter-turn gap of the compensation winding. This is not limited in this embodiment of this disclosure.

With reference to the first aspect, in some implementations of the first aspect, the shielding winding is adjacent to the primary winding. Correspondingly, in this case, the shielding winding may be adjacent to the primary winding, or the shielding winding may be adjacent to both the primary winding and the secondary winding. A first terminal of the compensation winding is connected to the electric potential quiescent point of the primary circuit, and a second terminal of the compensation winding may be unconnected.

Alternatively, the shielding winding may be adjacent to the secondary winding. Correspondingly, in this case, the shielding winding may be adjacent to the secondary winding, or the shielding winding may be adjacent to both the primary winding and the secondary winding. A first terminal of the compensation winding is connected to the electric potential quiescent point of the secondary circuit, and a second terminal of the compensation winding may be unconnected.

It should be noted that, when the shielding winding is adjacent to the primary winding and the secondary winding, the shielding winding can shield the noise current coupled directly from the primary winding to the secondary winding. When the shielding winding is adjacent to the compensation winding, the shielding winding can shield the noise current coupled from the primary winding to the secondary winding through the inter-turn gap of the compensation winding.

Therefore, in this embodiment of this disclosure, when the primary winding is disposed on both sides of the secondary winding, or the secondary winding is disposed on both sides of the primary winding, the shielding winding may be disposed between the primary winding and the secondary winding, to shield the electric field coupling between the primary winding and the secondary winding. Further, in this embodiment of this disclosure, there may be one, two, or more shielding windings. This is not limited in this embodiment of this disclosure.

In some optional embodiments, there may be at least one compensation winding (for example, one, two, or more compensation windings). This is not limited in this embodiment of this disclosure.

With reference to the first aspect, in some implementations of the first aspect, a projection of the primary winding on a first plane along a z axis and/or a projection of the secondary winding on the first plane along the z axis are/is located in a projection of the shielding winding on the first plane along the z axis, the first plane is a plane on which a surface of the PCB winding board is located, and the z axis is perpendicular to the first plane.

A projection of the PCB winding board on the first plane is a ring whose cross section is perpendicular to the first plane, and the primary winding, the secondary winding, and the shielding winding are all located within the cross section.

In this way, the shielding winding can well shield the electric field coupling between the primary winding and the secondary winding.

With reference to the first aspect, in some implementations of the first aspect, the compensation winding is adjacent to the secondary winding, and a first terminal of the compensation winding is connected to the electric potential quiescent point of the primary circuit.

With reference to the first aspect, in some implementations of the first aspect, the compensation winding is adjacent to the primary winding, and a first terminal of the compensation winding is connected to the electric potential quiescent point of the secondary circuit.

With reference to the first aspect, in some implementations of the first aspect, the secondary circuit includes a secondary rectifier diode and a secondary filter capacitor, and when the secondary rectifier diode is connected to a negative electrode of the secondary filter capacitor, the first terminal of the compensation winding and the first terminal of the primary winding are non-dotted terminals.

With reference to the first aspect, in some implementations of the first aspect, the secondary circuit includes a secondary rectifier diode and a secondary filter capacitor, and when the secondary rectifier diode is connected to a positive electrode of the secondary filter capacitor, the first terminal of the compensation winding and the first terminal of the primary winding are dotted terminals.

With reference to the first aspect, in some implementations of the first aspect, the compensation winding is adjacent to a first winding layer in a first winding; the first winding is the primary winding adjacent to the compensation winding or the secondary winding adjacent to the compensation winding; and an $(Ns)^{th}$ turn to an $(Ns+B-1)^{th}$ turn of coils of the first winding are disposed at the first winding layer, where N satisfies the following condition:

$N=Nb \times C$, and $Nb=2 \times Ns+B-2$, where an induced voltage generated by Nb turns of coils is equal to an induced voltage generated by the first winding, C is a real number greater than 0, and Nb, Ns, and B are positive numbers.

In actual engineering design, restricted by space of a winding channel of a PCB winding, a quantity of turns of the winding is limited to some extent. Therefore, a turn of coil with a relatively small sequence number in the secondary winding may be preferentially arranged adjacent to the compensation winding. This can further reduce a value of Nb.

With reference to the first aspect, in some implementations of the first aspect, a value range of C is [1.56, 2.16] or [0, 1].

For example, the secondary circuit includes a secondary rectifier diode and a secondary filter capacitor, and when the secondary rectifier diode is connected to a negative electrode of the secondary filter capacitor, the first terminal of the compensation winding and the first terminal of the primary winding are non-dotted terminals. In this case, a value of C is greater than 1.

Therefore, in this case, a noise current that needs to be cancelled by the compensation winding is greater than a common mode noise current generated by the secondary winding, and positive compensation may be performed on the quantity Nb of turns of coils by setting the value (which is greater than 1) of C, to further obtain the quantity N of turns of coils of the compensation winding 54. Because the shielding winding can reduce or even eliminate a noise current Isp that is formed by coupling a jump voltage Vp of the primary circuit to the secondary winding and that flows to the ground, the shielding winding can be disposed to reduce the value of C, that is, reduce the quantity of turns of the compensation winding. In some optional embodiments, the value range of C is [1.56, 2.16].

For example, the secondary circuit includes a secondary rectifier diode and a secondary filter capacitor, and when the secondary rectifier diode is connected to a positive electrode of the secondary filter capacitor, the first terminal of the compensation winding and the first terminal of the primary winding are non-dotted terminals. In this case, the value range of C is [0, 1].

Therefore, in this case, a noise current that needs to be cancelled by the compensation winding is less than common mode noise generated by the secondary winding, and negative compensation may be performed on the quantity Nb of turns of coils by setting the value (which is between 0 and 1) of C, to further obtain the quantity N of turns of coils of the compensation winding 54. Because the shielding winding can reduce or even eliminate a noise current Id1 that is formed by coupling a jump voltage Vp of the primary circuit to the secondary winding and that flows to the ground, the shielding winding can be disposed to reduce the value of C, that is, reduce the quantity of turns of coils of the compensation winding.

Optionally, the value of C may be determined based on a noise current that is formed by coupling a potential jump of the primary winding to a line impedance stabilization network LISN through a space coupling capacitor.

With reference to the first aspect, in some implementations of the first aspect, a second terminal of the compensation winding is unconnected.

With reference to the first aspect, in some implementations of the first aspect, the electric potential quiescent point of the primary circuit includes a point that is in the primary circuit and that is connected to a positive electrode of a bus capacitor or connected to a primary working ground network, and the electric potential quiescent point of the secondary circuit includes a point that is in the secondary circuit and that is connected to a positive electrode of a secondary output filter capacitor or connected to a secondary working ground network, where a voltage of the electric potential quiescent point does not jump in a circuit working process.

With reference to the first aspect, in some implementations of the first aspect, the primary winding includes at least one turn of primary power winding and/or an auxiliary winding connected to the primary circuit.

With reference to the first aspect, in some implementations of the first aspect, the secondary winding includes at least one turn of secondary power winding and/or the auxiliary winding connected to the primary circuit.

With reference to the first aspect, in some implementations of the first aspect, a first terminal of the shielding winding is connected to the electric potential quiescent point of the primary circuit or an electric potential quiescent point of the secondary winding, and a second terminal of the shielding winding is unconnected.

According to a second aspect, a power conversion circuit is provided, including the planar transformer, the primary circuit, and the secondary circuit according to any one of the first aspect or the possible implementations of the first aspect, where the planar transformer is disposed between the primary circuit and the secondary circuit.

According to a third aspect, an adapter is provided, including the power conversion circuit according to the second aspect.

DESCRIPTION OF EMBODIMENTS

Figure 1:
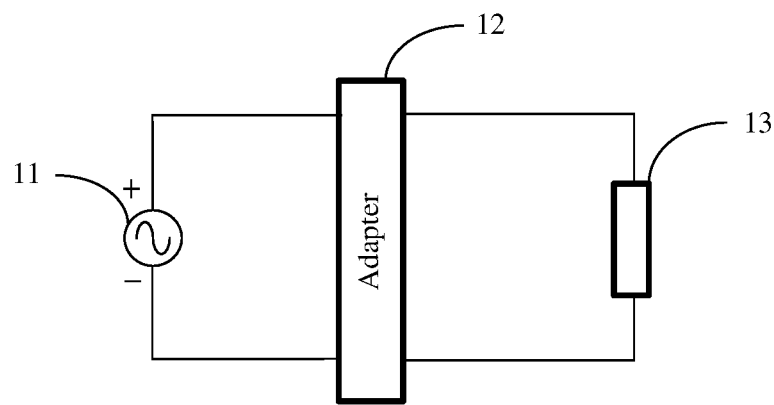
FIG. 1 is a schematic diagram of an application scenario according to an embodiment of this disclosure.

The following describes technical solutions of this disclosure with reference to accompanying drawings.

To facilitate understanding of the embodiments of this disclosure, the following first describes some terms used in the embodiments of this disclosure.

Planar transformer: Different from a conventional transformer structure, a magnetic core and a winding of the planar transformer are of planar structures. The magnetic core usually uses a flat magnetic core structure, for example, a small-sized E-type magnetic core structure or RM-type magnetic core structure. The winding is usually formed through lap winding of a multi-layer printed circuit board (PCB). Such a design is characterized by a relatively low direct current resistance, a relatively small leakage inductance and distributed capacitance, a quite small height, and a relatively high working frequency.

Flyback converter: It is widely applied to alternating current/direct current (AC/DC) and direct current/direct current (DC/DC) conversion, is a relatively common low-power switching power converter, and has advantages of a simple structure and low costs. Core components of the flyback converter include a power switch transistor, a transformer, a diode, and a capacitor. The power switch transistor is controlled through pulse width modulation. A high-frequency square wave signal is generated in a primary coil of the transformer through switch-off and switch-on of the power switch transistor, and then is inductively coupled to a secondary coil of the transformer, to implement energy transfer. A stable direct current output is obtained at an output end through filtering and rectification by a diode and a capacitor in a secondary circuit.

Common mode noise: The common mode noise is also referred to as asymmetrical noise or line-to-ground noise. Such noise exists in all electrical devices that use an alternating current power supply. A common mode noise current flows in a same direction on two power transmission lines, keeps a same phase relative to the ground, and is returned through a ground cable. The common mode noise can be suppressed by using a common mode inductor, or a Y capacitor used between two transmission lines and the ground.

Electric potential quiescent point: In a circuit network, a voltage potential amplitude of the network node keeps relatively constant in a circuit working process, and has no high-frequency jump or oscillation. For example, for a filter capacitor after a rectifier circuit in a primary circuit of a flyback converter and a filter capacitor located after a rectifier circuit in a secondary circuit of the flyback converter, positive electrodes or negative electrodes of these capacitors and network nodes directly connected to these positive electrodes or negative electrodes are electric potential quiescent points.

This disclosure provides a planar transformer, a power conversion circuit, and an adapter. The transformer may be disposed in the power conversion circuit, and the power conversion circuit may be disposed in the adapter.

Specifically, the adapter may be applied to a scenario of charging a device or supplying power to a device. For example, FIG. 1 shows a possible application scenario according to an embodiment of this disclosure. As shown in FIG. 1, there are an external power supply 11, an adapter 12, and a to-be-charged device 13 in the application scenario. For example, the to-be-charged device 13 may include a cellular phone, a notebook computer, and a battery. This is not limited in this embodiment of this disclosure. Usually, the adapter 12 may be connected to the external power supply 11. A power conversion circuit included in the adapter 12 is configured to: convert a relatively high voltage provided by the external power supply 11 into a relatively low voltage that satisfies a charging or power supply standard of the to-be-charged device 13, and charge the to-be-charged device 13 or supply power to the to-be-charged device 13.

The planar transformer provided in this embodiment of this disclosure can reduce noise generated during operation. The noise may include common mode noise. The power conversion circuit may be a switching power converter. For example, the switching power converter may include a flyback converter. The common mode noise mainly includes noise, flowing to a reference ground, caused due to a mutual effect between parameters of a circuit of a switch-mode power supply. The following describes a generation and transmission mechanism of common mode noise in a power conversion circuit 20 with reference to FIG. 2 and FIG. 3.

Figure 2:
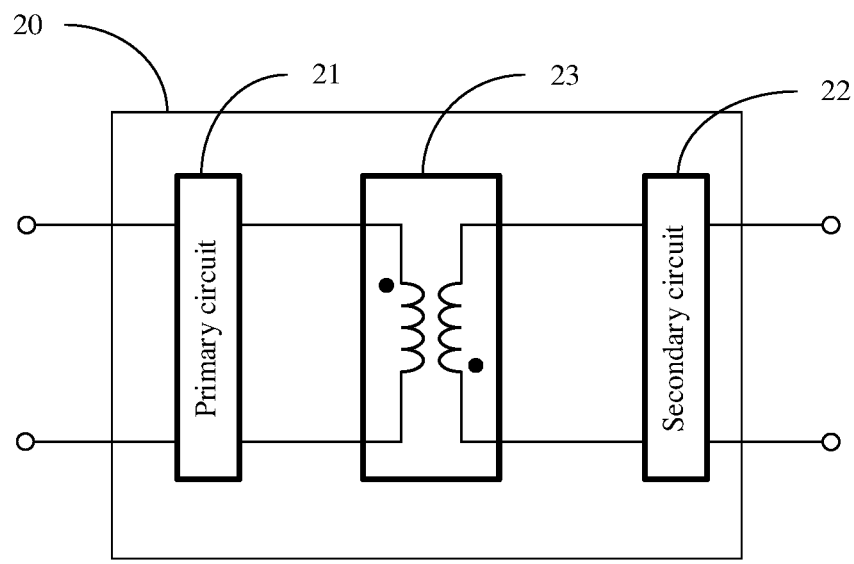
FIG. 2 is a schematic diagram of a power conversion circuit according to an embodiment of this disclosure.
Figure 3:
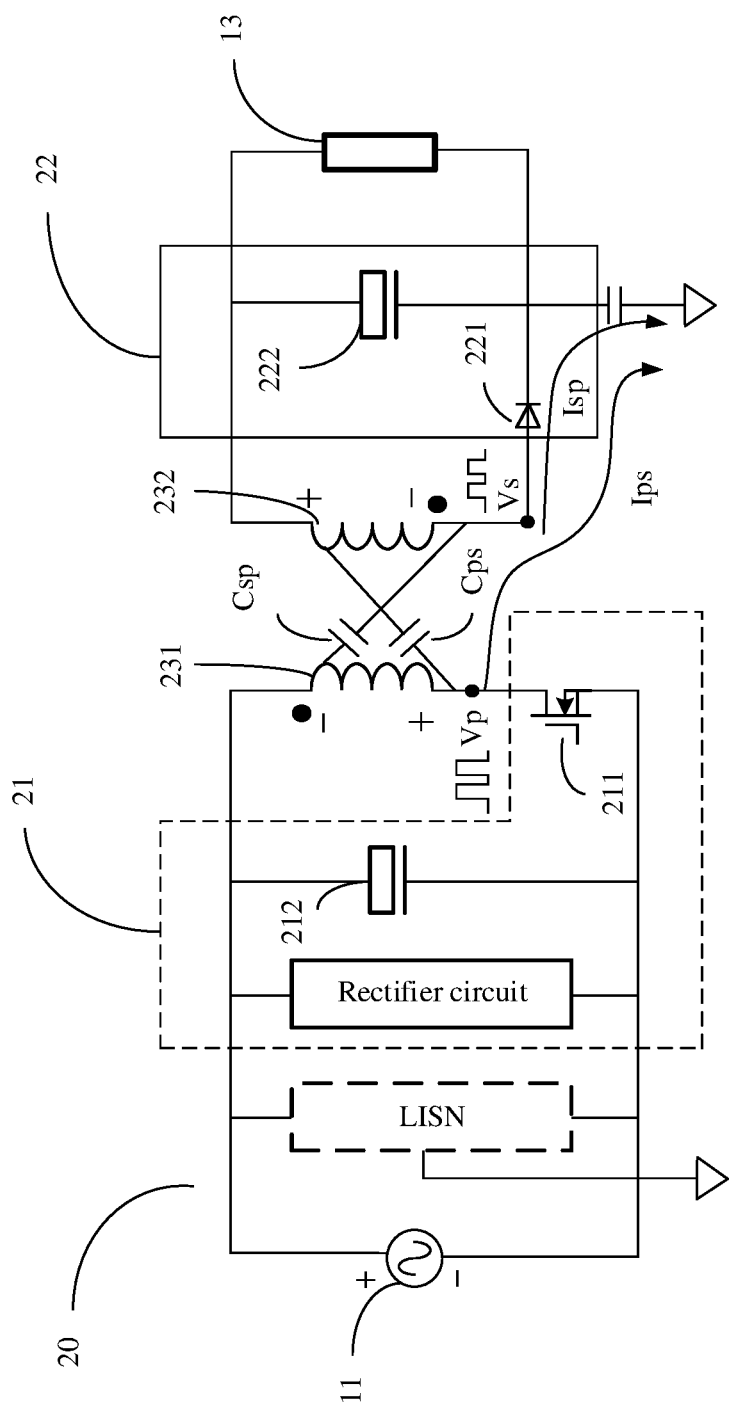
FIG. 3 is a schematic diagram of a power conversion circuit according to an embodiment of this disclosure.

As shown in FIG. 2, the power conversion circuit 20 usually includes a primary circuit 21, a secondary circuit 22, and a transformer 23. As shown in FIG. 3, the primary circuit usually includes a primary switch transistor 211 and a primary filter capacitor 212. Further, the primary circuit further includes a rectifier circuit. The primary switch transistor 211 may also be referred to as a power switch transistor. The secondary circuit 22 usually includes a secondary rectifier diode 221 and a secondary filter capacitor 222. The transformer 23 includes a primary winding 231, a magnetic core, and a secondary winding 232. The primary winding 231 may be connected to the primary switch transistor 211 and the primary filter capacitor 212, and the secondary winding 232 may be connected to the secondary rectifier diode 221 and the secondary filter capacitor 222. The primary filter capacitor 212 and the secondary filter capacitor 222 are usually electrolytic capacitors.

Usually, a node connected to either of two ends of the primary filter capacitor 212 is an electric potential quiescent point of the primary circuit, or a ground node of the primary circuit may be an electric potential quiescent point of the primary circuit. A node connected to either of two ends of the secondary filter capacitor 222 is an electric potential quiescent point of the secondary circuit.

During operation of the power conversion circuit 20, an alternating current input by the external power supply 11 is converted into a stable high-voltage direct current after being rectified and filtered by the primary circuit 21, and is input to the primary winding 231 of the transformer 23. The primary switch transistor 211 connected to the primary winding 231 couples a voltage of the primary winding 231 to the secondary winding 232 through high-frequency switch-on and switch-off. After the voltage coupled to the secondary winding 232 is rectified and filtered by the secondary circuit 22, a low-voltage direct current is output to a load to charge the load or supply power to the load. The load is the to-be-charged device 13. During operation of the power conversion circuit 20, the primary switch transistor 211 generates a jump voltage Vp due to high-frequency switch-on and switch-off, and the secondary rectifier diode 221 generates a jump voltage Vs due to high-frequency switch-on and switch-off.

Because a parasitic capacitance exists between the primary winding 231 and the secondary winding 232 of the transformer, common mode noise is generated from the jump voltages Vp and Vs in the power conversion circuit by using the parasitic capacitance. Specifically, referring to FIG. 3, the parasitic capacitance includes a distributed capacitance Cps caused by the primary winding to the secondary winding and a distributed capacitance Csp caused by the secondary winding to the primary winding. A noise current Ips flowing to the ground is generated from the jump voltage Vp of the primary circuit through Cps, and a noise current Isp flowing to the ground is generated from the jump voltage Vs of the secondary circuit through Csp. The noise current Ips and the noise current Isp are common mode noise.

How to suppress the common mode noise is one of difficulties in designing a highly competitive adapter in the industry currently.

It should be noted that FIG. 3 further shows a line impedance stabilization network (LISN) circuit. The LISN circuit is a test circuit, and is configured to detect a common mode noise current flowing to the ground during operation of the power conversion circuit. In other words, it may be considered that the current that flows to the ground and that is detected by the LISN network is equivalent to common mode noise generated by the power conversion circuit.

Based on the foregoing problem, an embodiment of this disclosure provides a planar transformer with relatively low common mode noise. A power conversion circuit using the planar transformer has relatively high noise suppression performance, and conducted emission (CE) and radiated emission (RE) of the power conversion circuit can be reduced. In addition, this disclosure further provides a power conversion circuit to which the planar transformer is applied, and an adapter to which the power conversion circuit is applied. Specifically, for the planar transformer, the power conversion circuit, and the adapter, refer to the descriptions in FIG. 1 to FIG. 3. For brevity, details are not described herein again.

Figure 4:
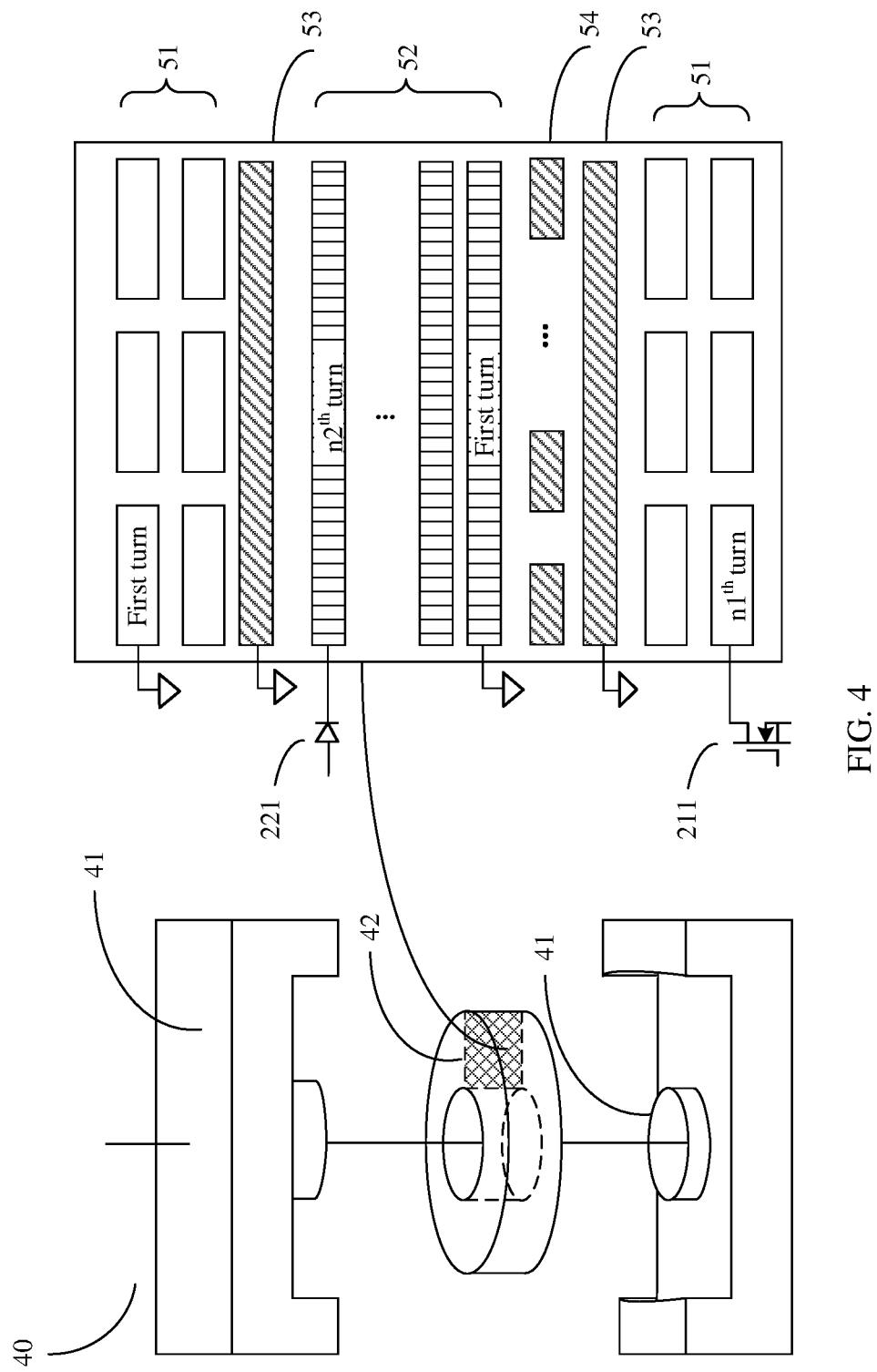
FIG. 4 is a schematic diagram of a planar transformer according to an embodiment of this disclosure.

The transformer provided in this embodiment of this disclosure mainly includes a magnetic core and a winding coil. The winding coil may be formed by burning a conventional copper wire or etching a multi-layer PCB. A transformer including a winding coil formed by etching a multi-layer PCB is flatter than a transformer including a winding coil formed by burning a conventional copper wire. Therefore, the transformer including the winding coil formed by etching the multi-layer PCB is usually referred to as a planar transformer. FIG. 4 is a schematic structural diagram of a planar transformer 40. As shown in FIG. 4, the planar transformer 40 includes a magnetic core 41 and a PCB winding board 42.

A material and a shape of the magnetic core 41 are not limited in this embodiment of this disclosure. For example, the magnetic core 41 may be in an EE shape, an EI shape, or an RM shape. A winding coil formed by a multi-layer circuit board may be disposed on a winding post of the magnetic core 41.

In some possible implementations, the magnetic core 41 in the planar transformer may be connected to an electric potential quiescent point of a primary circuit of a power conversion circuit, or may be connected to an electric potential quiescent point of a secondary circuit of the power conversion circuit. This is not limited in this embodiment of this disclosure.

As shown in FIG. 4, the foregoing PCB winding board 42 includes a primary winding 51, a secondary winding 52, a shielding winding 53, and a compensation winding 54.

A first terminal of the primary winding 51 is connected to an electric potential quiescent point of a primary circuit of a power conversion circuit, for example, a point connected to a primary working ground network. A first turn of coil of the primary winding is disposed at a start position of the first terminal of the primary winding. Alternatively, the electric potential quiescent point of the primary circuit may be a point that is in the primary circuit and that is connected to a positive electrode of a bus capacitor. This is not limited in this embodiment of this disclosure.

A first terminal of the secondary winding 52 is connected to an electric potential quiescent point of a secondary circuit of the power conversion circuit, for example, a point connected to a secondary working ground network. A first turn of coil of the secondary winding is disposed at a start position of the first terminal of the secondary winding. Alternatively, the electric potential quiescent point of the primary circuit may be a point that is in the secondary circuit and that is connected to a positive electrode of a secondary output filter capacitor. This is not limited in this embodiment of this disclosure.

The shielding winding 53 is disposed between the primary winding 51 and the secondary winding 52, and is configured to shield electric field coupling between the primary winding and the secondary winding.

A first terminal of the shielding winding 53 may be connected to an electric potential quiescent point, for example, may be connected to the electric potential quiescent point of the primary circuit or an electric potential quiescent point of the secondary winding. Alternatively, a first terminal of the shielding winding 53 may be connected to an electric potential quiescent point through one or more of a capacitor, a resistor, and an inductor. For example, the first terminal of the shielding winding 53 may be connected to one end of the first turn of coil of the primary circuit far away from the electric potential quiescent point of the primary circuit or connected to one end of the first turn of coil of the secondary circuit far away from the electric potential quiescent point of the secondary circuit.

A second terminal of the shielding winding 53 is unconnected.

The compensation winding 54 is adjacent to the primary winding 51 or adjacent to the secondary winding 52, where the compensation winding 54 includes N turns of coils. It should be understood that there is a gap between every two adjacent turns of coils of the compensation winding 54. N is a positive number greater than 1.

A first terminal of the compensation winding 54 may be connected to an electric potential quiescent point. The first terminal of the compensation winding 54 may be connected to the electric potential quiescent point of the primary circuit 51, or may be connected to an electric potential quiescent point of the secondary winding 52. A first turn of coil of the compensation winding may be disposed at a start position of the first terminal of the compensation winding 54. Alternatively, the first terminal of the compensation winding 54 may be connected to an electric potential quiescent point through one or more of a capacitor, a resistor, and an inductor.

Optionally, a second terminal of the compensation winding 54 may be unconnected, where the second terminal is corresponding to one end of a last turn of coil of the compensation winding 54.

In this embodiment of this disclosure, the shielding winding and the compensation winding that has a plurality of turns of coils are disposed between the primary winding and the secondary winding of the planar transformer. The shielding winding can shield the electric field coupling between the primary winding and the secondary winding, thereby suppressing a noise current between the primary winding and the secondary winding. Common mode noise generated by the compensation winding cancels common mode noise flowing to the secondary winding or the primary winding, to minimize common mode noise of an entire system. In this embodiment of this disclosure, because the shielding winding can reduce the noise current between the primary winding and the secondary winding, a total quantity of turns of the compensation winding can be reduced. Based on this, a quantity of turns of coils of the compensation winding that are required in this embodiment of this disclosure is reduced, thereby facilitating improvement of design and mass production consistency of the PCB winding board.

Further, because the common mode noise can be fully suppressed in this embodiment of this disclosure, conducted emission (CE) can be effectively reduced in this embodiment of this disclosure, thereby reducing an input common mode inductance. In addition, for a high frequency band (for example, above 30 MHz), an electromagnetic shielding technology is used in this embodiment of this disclosure, so that impact of frequency coupling of the secondary winding on the primary winding can be reduced, thereby reducing radiated emission (RE).

In addition, in this embodiment of this disclosure, the common mode noise can be fully suppressed, and the CE and the RE can be effectively reduced. Therefore, the power conversion circuit in this embodiment of this disclosure can reduce a value of a Y capacitor bridged between the primary circuit and the secondary circuit or even cancel the Y capacitor, so that a higher-safety power conversion circuit having a Y capacitor with a small capacitance value or even having no Y capacitor can be provided, and costs and a size of the power conversion circuit can be reduced.

In this embodiment of this disclosure, that the shielding winding can shield the electric field coupling between the primary winding and the secondary winding includes the following two cases.

In a first case, when the first terminal of the shielding winding is connected to the electric potential quiescent point of the primary circuit, the shielding winding can shield coupling of an electric field of the primary winding to the secondary winding. In this case, the shielding winding may be disposed close to the secondary winding, that is, adjacent to the secondary winding.

In a second case, when the first terminal of the shielding winding is connected to the electric potential quiescent point of the secondary circuit, the shielding winding can shield coupling of an electric field of the secondary winding to the primary winding. In this case, the shielding winding may be disposed close to the primary winding, that is, adjacent to the primary winding.

In the following embodiments, for ease of description, an example is used for description in which the first terminal of the shielding winding is connected to the electric potential quiescent point of the primary circuit and the shielding winding is adjacent to the secondary winding, but the embodiments of this disclosure are not limited thereto.

That the shielding winding is configured to shield coupling of an electric field of the primary winding to the secondary winding means that the shielding winding can shield a noise current coupled from the primary winding to the secondary winding. For example, the shielding winding can shield a noise current coupled directly from the primary winding to the secondary winding, or shield a noise current coupled from the primary winding to the secondary winding through an inter-turn gap of the compensation winding. This is not limited in this embodiment of this disclosure.

In this embodiment of this disclosure, a second terminal of the primary winding 51 may be connected to a primary switch transistor in the primary circuit, for example, the primary switch transistor 211 in FIG. 3. This is not limited in this embodiment of this disclosure. The second terminal of the primary winding 51 may be corresponding to one end of a last turn (for example, an $(n1)^{th}$ turn) of coil of the primary winding 51.

In this embodiment of this disclosure, a second terminal of the secondary winding 52 may be connected to a secondary rectifier diode in the secondary circuit, for example, the secondary rectifier diode 221 in FIG. 3. This is not limited in this embodiment of this disclosure. The second terminal of the secondary winding 52 may be corresponding to one end of a last turn (for example, an $(n2^{th})$ turn) of coil of the secondary winding 52.

In this embodiment of this disclosure, that the other end is unconnected may mean that there is no electrical connection between the other end and any conductor or that a winding with the end that is unconnected cannot form a closed loop with another component in the planar transformer or the power conversion circuit.

In some possible implementations, the primary winding 51 may include at least one primary winding layer, and a coil of the primary winding may be disposed at the at least one primary winding layer. The secondary winding 52 may include at least one secondary winding layer, and a coil of the secondary winding may be disposed at the at least one secondary winding layer. In this embodiment of this disclosure, the coil may be formed by using a conducting layer.

In some optional embodiments, the primary winding 51 may include at least one turn of primary power winding, and/or an auxiliary winding connected to the primary circuit. The auxiliary winding may be a winding that is in the power conversion circuit and that provides a low-power power supply for circuits other than a main power circuit. The circuits other than the main power circuit may include, for example, a drive circuit, a control circuit, and a detection circuit.

In some possible implementations, a coil of a primary power winding may be disposed on at least one primary winding layer of the primary winding 51. When there are a plurality of coils in the primary power winding, the coils may be connected to each other in series. Optionally, a coil of an auxiliary winding connected to the primary circuit may further be disposed at the at least one primary winding layer.

In some optional embodiments, the secondary winding 52 may include at least one turn of secondary power winding, and/or an auxiliary winding connected to the primary circuit. A coil of the secondary power winding may be disposed at the at least one secondary winding layer of the secondary winding 52. Similar to the primary power winding, coils may be connected to each other in series. Optionally, a coil of an auxiliary winding may further be disposed at the at least one secondary winding layer.

In some possible implementations, the shielding winding 53 may include a shielding winding layer. Optionally, the shielding winding layer includes one turn of winding made of metal foil (for example, copper foil). For example, the shielding winding layer is one turn of ring winding formed by a large-area bulk conductor.

For example, a quantity of turns of the shielding winding 53 may alternatively be less than 1. This is not limited in this embodiment of this disclosure.

In some possible implementations, the compensation winding 54 may include a compensation winding layer, and the compensation winding layer includes N turns of coils. N is a positive number greater than 1.

It should be noted that, in this embodiment of this disclosure, that two windings are adjacent to each other means that there is no other winding layer between winding layers at which the two windings are located. For example, that the compensation winding 54 is adjacent to the primary winding 51 means that there are no other winding layers between a winding layer at which the compensation winding 54 is located and at least one winding layer at which the primary winding 51 is located.

It should be noted that, because a cross section of the planar transformer 40 is symmetric, FIG. 4 illustrates a schematic diagram of half a cross section of the PCB winding board 42. For example, the cross section is located on a zr plane formed by a z axis and an r axis, where the z axis is perpendicular to a plane (for example, which may also be referred to as a first plane) on which a surface of the PCB winding board is located, and the r axis is perpendicular to the z axis and points to a direction of a center of the PCB winding board. In other words, the zr plane is perpendicular to the first plane. Similarly, FIG. 5 to FIG. 13 below illustrate schematic cross-sectional views of planar transformers.

In some optional embodiments, the primary winding 51, the secondary winding 52, and the shielding winding 53 are all located within the cross section, and a projection of the primary winding 51 on the first plane along the z axis and a projection of the secondary winding 52 on the first plane along the z axis are both located in a projection of the shielding winding 53 on the first plane along the z axis. In this way, the shielding winding can completely shield the electric field coupling between the primary winding 51 and the secondary winding 52.

In some optional embodiments, the primary winding 51, the secondary winding 52, and the shielding winding 53 are all located within the cross section, and a projection of the primary winding 51 on the first plane along the z axis or a projection of the secondary winding 52 on the first plane along the z axis is located in a projection of the shielding winding 53 on the first plane along the z axis. This is easy to implement in a process. In addition, for the electric field coupling between the primary winding 51 and the secondary winding 52, the shielding winding can achieve a relatively good shielding effect.

Figure 5:
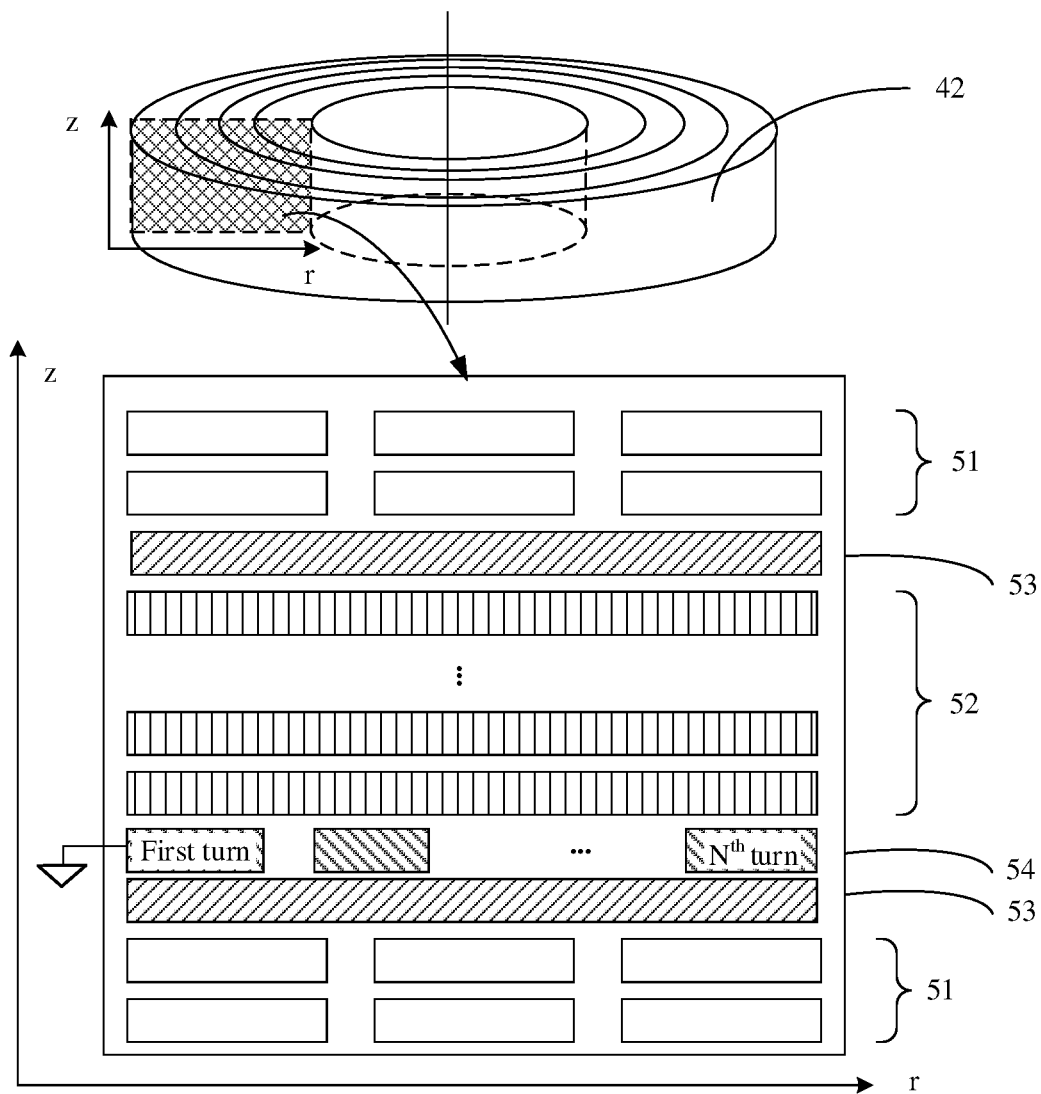
FIG. 5 is a schematic cross-sectional view of a planar transformer according to an embodiment of this disclosure.
Figure 6:
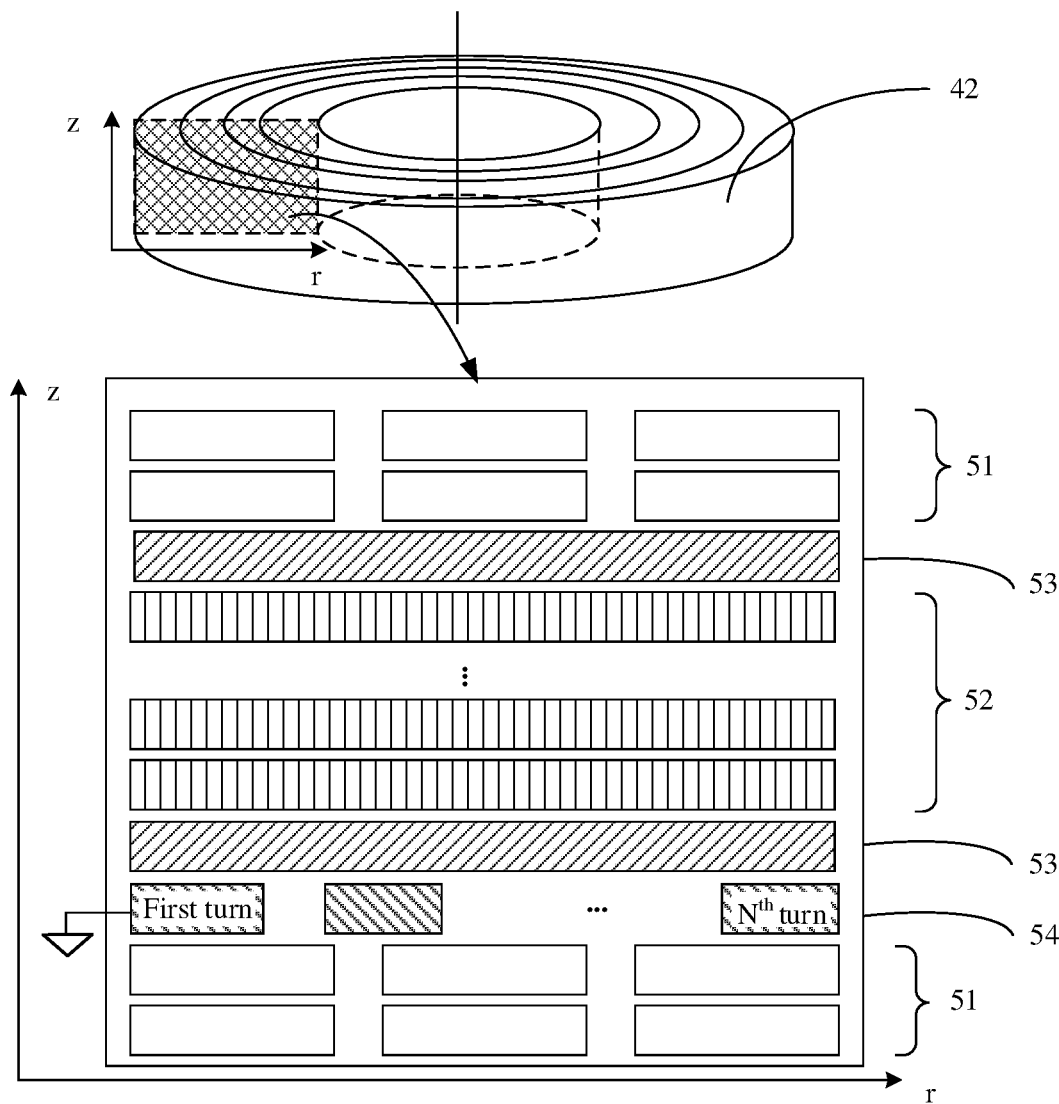
FIG. 6 is a schematic cross-sectional view of another planar transformer according to an embodiment of this disclosure.

FIG. 5 and FIG. 6 each show an example of a winding coil in a PCB winding board. In planar transformers shown in FIG. 5 and FIG. 6, a first terminal of a shielding winding is connected to an electric potential quiescent point of a primary circuit of a power conversion circuit, for example, a point in a primary working ground network. It should be noted that, in this embodiment of this disclosure, same reference signs indicate same or similar meanings, and details are not described herein again.

For example, as shown in FIG. 5, the compensation winding 54 is adjacent to the secondary winding 52, and the shielding winding 53 may be adjacent to the primary winding 51, or the shielding winding 53 may be adjacent to both the primary winding 51 and the secondary winding 52. For example, the planar transformer shown in FIG. 5 includes two shielding windings, where one shielding winding is adjacent to both the primary winding 51 and the secondary winding 52, and the other shielding winding is adjacent to the primary winding 51 and the compensation winding. A first terminal of the compensation winding 54 is connected to the electric potential quiescent point of the primary circuit, where a first turn of coil of the compensation winding is disposed at a start position of the first terminal of the compensation winding. Optionally, a second terminal of the compensation winding 54 may be unconnected, where the second terminal is corresponding to one end of a last turn (that is, an $N^{th}$ turn) of coil of the compensation winding 54.

For another example, as shown in FIG. 6, the compensation winding 54 is adjacent to the primary winding 51, and the shielding winding 53 may be adjacent to the secondary winding 52, or the shielding winding 53 may be adjacent to both the primary winding 51 and the secondary winding 52. For example, the planar transformer shown in FIG. 6 includes two shielding windings, where one shielding winding is adjacent to both the primary winding 51 and the secondary winding 52, and the other shielding winding is adjacent to the secondary winding 52 and the compensation winding 54. A first terminal of the compensation winding 54 is connected to an electric potential quiescent point of a secondary circuit, where a first turn of coil of the compensation winding is disposed at a start position of the first terminal of the compensation winding. Optionally, a second terminal of the compensation winding 54 may be unconnected, where the second terminal is corresponding to one end of a last turn (that is, an $N^{th}$ turn) of coil of the compensation winding 54.

It should be noted that, when the shielding winding is adjacent to the primary winding and the secondary winding, the shielding winding can shield a noise current coupled directly from the primary winding to the secondary winding. When the shielding winding is adjacent to the compensation winding, the shielding winding can shield a noise current coupled from the primary winding to the secondary winding through an inter-turn gap of the compensation winding.

Therefore, in this embodiment of this disclosure, when the primary winding is disposed on both sides of the secondary winding, or the secondary winding is disposed on both sides of the primary winding, the shielding winding may be disposed between the primary winding and the secondary winding, to shield the electric field coupling between the primary winding and the secondary winding. Therefore, in this embodiment of this disclosure, there may be one, two, or more shielding windings. This is not limited in this embodiment of this disclosure.

In some optional embodiments, there may be at least one compensation winding 54 (for example, one, two, or more compensation windings 54). This is not limited in this embodiment of this disclosure. When there are two or more compensation windings, connection manners of the at least two compensation windings are similar.

In some optional embodiments, there may be three cases as follows for relative positions of the primary winding 51 and the secondary winding 52.

Case 1: The primary winding 51 may be disposed on both sides of the secondary winding 52. To be specific, a part of a primary winding layer in the primary winding 51 is disposed on one side of the secondary winding 52, and the other part of the primary winding layer in the primary winding 51 is disposed on the other side of the secondary winding 52, to form a "sandwich"-like structure. In this way, high-frequency eddy-current losses and leakage inductances of the windings can be reduced.

Case 2: The secondary winding 52 may be disposed on both sides of the primary winding 51.

Case 3: All primary winding layers included in the primary winding 51 are disposed on one side, such as an upper side or a lower side, of all winding layers of the secondary winding 52.

It should be noted that, in the first or second case, there are two positions at which the primary winding 51 is adjacent to the secondary winding 52. Correspondingly, the shielding winding 53 may include two shielding winding layers, and the two shielding winding layers each are disposed between a primary winding layer and a secondary winding layer that are adjacent to each other. In the third case, the shielding winding 53 may include one shielding winding layer.

Figure 7:
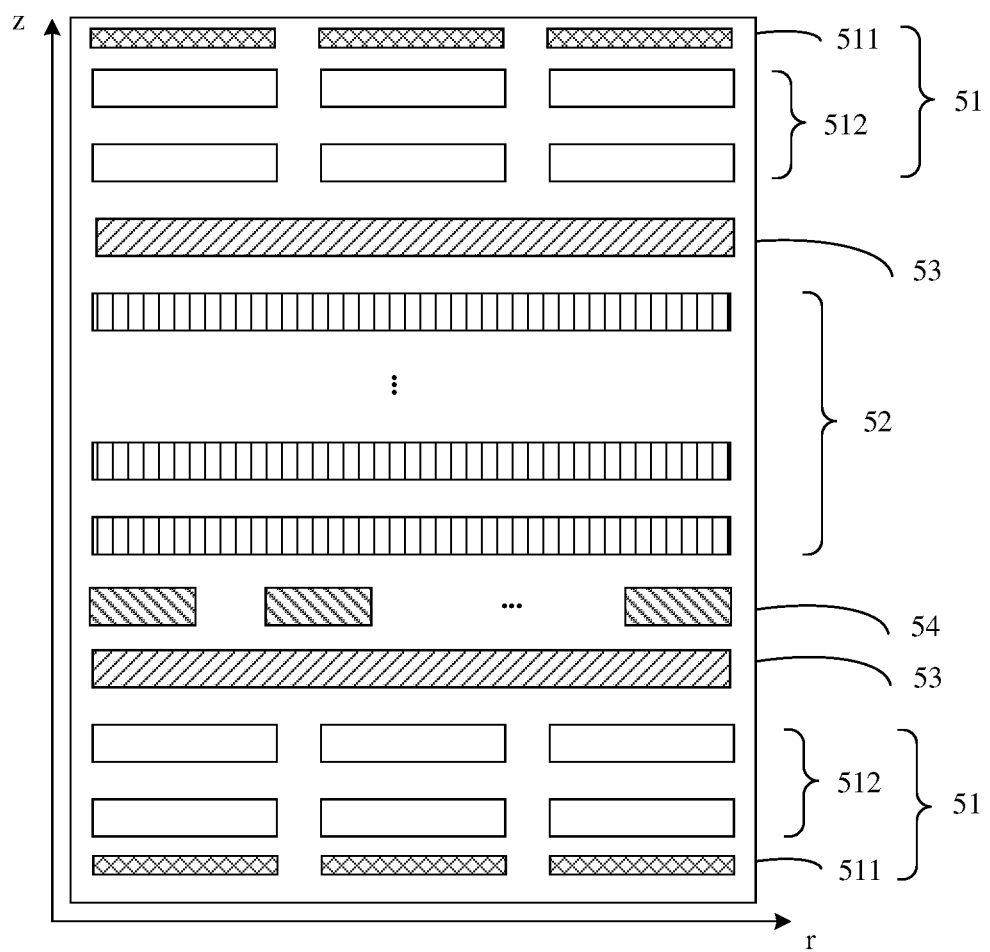
FIG. 7 is a schematic cross-sectional view of another planar transformer according to an embodiment of this disclosure.
Figure 8:
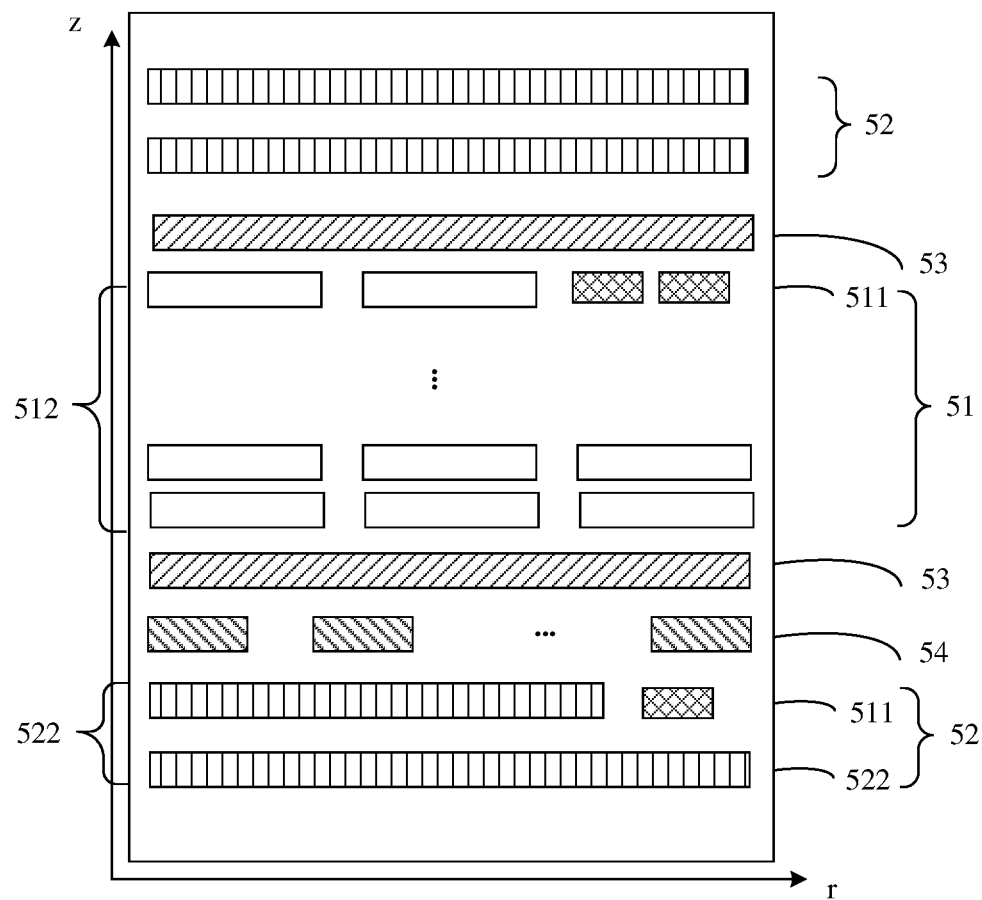
FIG. 8 is a schematic cross-sectional view of another planar transformer according to an embodiment of this disclosure.
Figure 9:
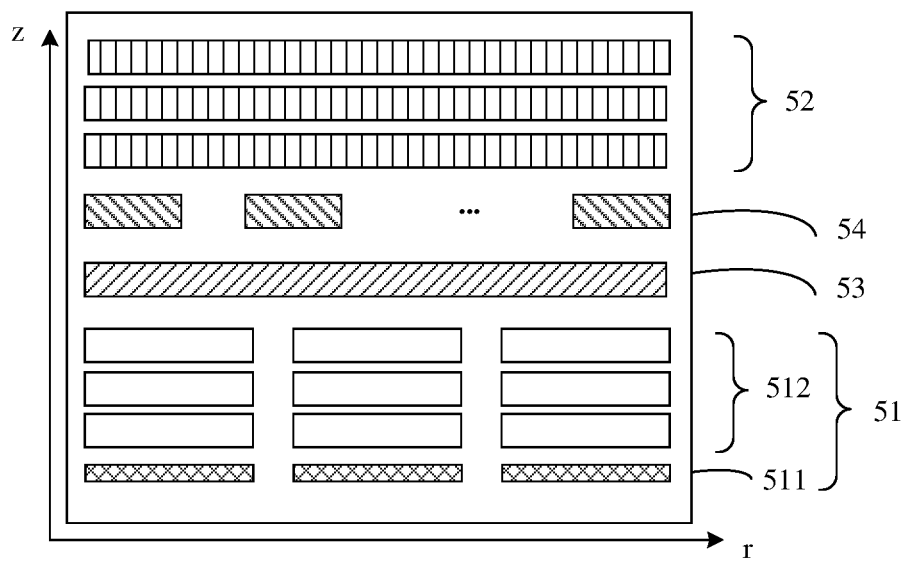
FIG. 9 is a schematic cross-sectional view of another planar transformer according to an embodiment of this disclosure.
Figure 10:
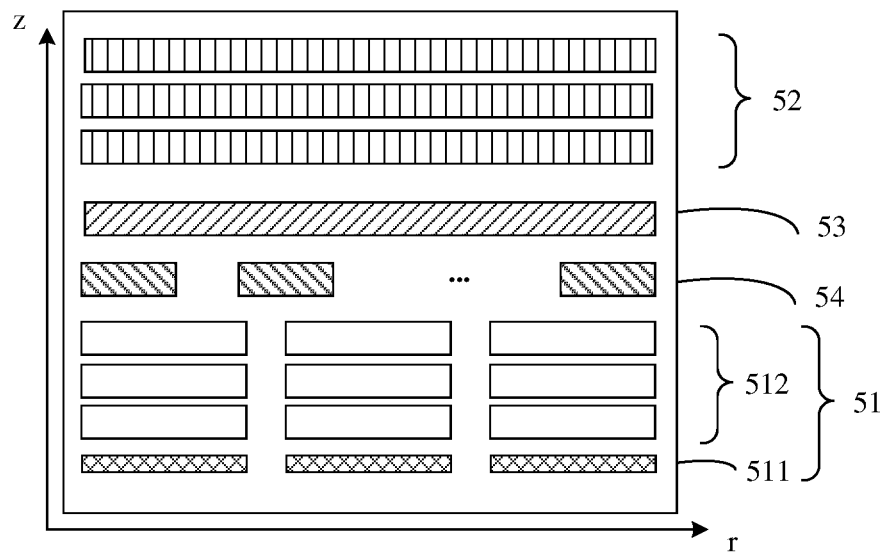
FIG. 10 is a schematic cross-sectional view of another planar transformer according to an embodiment of this disclosure.
Figure 11:
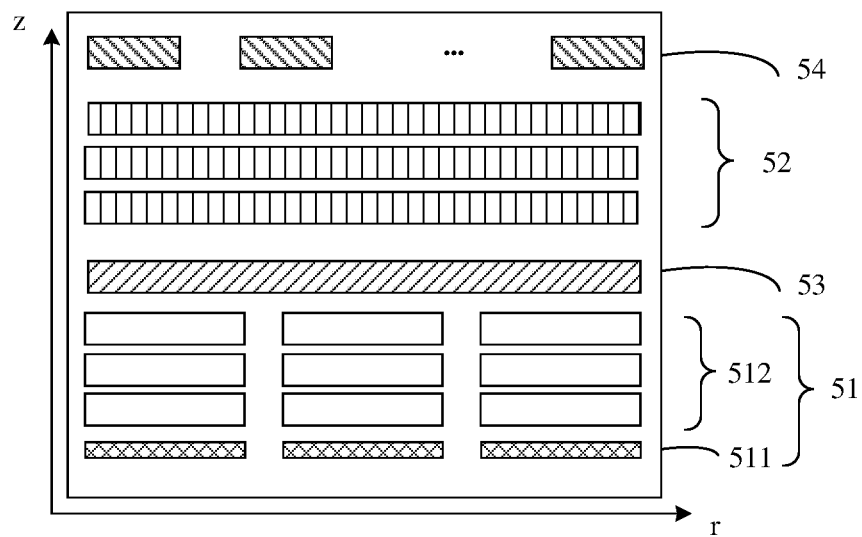
FIG. 11 is a schematic cross-sectional view of another planar transformer according to an embodiment of this disclosure.

FIG. 7 to FIG. 11 show examples of some possible winding coils according to embodiments of this disclosure. For example, FIG. 5, FIG. 6, and FIG. 7 show examples of the first position, FIG. 8 shows an example of the second position, and FIG. 9 to FIG. 11 show examples of the third position.

It should be understood that the winding coils shown in FIG. 7 to FIG. 11 are merely examples, but this embodiment of this disclosure is not limited thereto. In addition, reference signs in FIG. 7 to FIG. 11 that are the same as those in FIG. 5 or FIG. 6 indicate same or similar meanings. For brevity, details are not described herein again.

As shown in FIG. 7 to FIG. 11, the primary winding 51 may include an auxiliary winding 511 and a primary power winding 512. In some optional embodiments, as shown in FIG. 8, the secondary winding 52 may include the auxiliary winding 511 and a secondary power winding 522.

In a planar transformer shown in FIG. 7, the primary winding 51 of the planar transformer is disposed on both sides of the secondary winding 52. Optionally, a first terminal of the compensation winding 54 is connected to an electric potential quiescent point of a primary circuit of a power conversion circuit, and the compensation winding 54 is adjacent to the secondary winding 52. For example, a first layer and a last layer of a PCB winding board of the planar transformer are both auxiliary winding layers, but this embodiment of this disclosure is not limited thereto.

In a planar transformer shown in FIG. 8, the secondary winding 52 of the planar transformer is disposed on both sides of the primary winding 51. Optionally, a first terminal of the compensation winding 54 is connected to an electric potential quiescent point of a primary circuit of a power conversion circuit, and the compensation winding 54 is adjacent to the secondary winding 52. For example, a coil of the primary power winding and a coil of the auxiliary winding may be disposed at a same layer, and a coil of the secondary power winding and the coil of the auxiliary winding may be disposed at a same layer, but this embodiment of this disclosure is not limited thereto.

In a planar transformer shown in FIG. 9, all primary winding layers included in the primary winding 51 of the planar transformer are disposed on one side, for example, a lower side, of all winding layers of the secondary winding 52. In addition, a first terminal of the compensation winding 54 is connected to an electric potential quiescent point of a primary circuit of a power conversion circuit, and the compensation winding 54 is adjacent to the secondary winding 52. For example, a last layer (for example, a lowest layer) of a PCB winding board of the planar transformer is an auxiliary winding layer, but this embodiment of this disclosure is not limited thereto.

Different from the planar transformer shown in FIG. 9, a first terminal of the compensation winding 54 shown in FIG. 10 is connected to an electric potential quiescent point of a secondary circuit of a power conversion circuit, and the compensation winding 54 is adjacent to the primary winding 51.

In addition, the compensation winding 54 in the planar transformer shown in FIG. 9 is disposed adjacent to the secondary winding 52 and close to one side of the primary winding 51. Different from the planar transformer shown in FIG. 9, the compensation winding 54 in a planar transformer shown in FIG. 11 is disposed adjacent to the secondary winding 52 and far away from the primary winding 51.

Specifically, for connection manners of windings in FIG. 7 to FIG. 11, refer to the descriptions in FIG. 4 to FIG. 6. For brevity, details are not described herein again.

In some optional embodiments, the compensation winding 54 is adjacent to a first winding layer in a first winding, where the first winding is the primary winding adjacent to the compensation winding or the secondary winding adjacent to the compensation winding. A quantity of turns of the compensation winding 54 is related to the first winding layer, that is, related to a primary winding layer or a secondary winding layer adjacent to the compensation winding 54. For example, an $(Ns)^{th}$ turn to an $(Ns+B-1)^{th}$ turn of coils of the first winding are disposed at the first winding layer, where N satisfies the following condition:

$$N = Nb \times C, \text{ and } Nb = 2 \times Ns + B - 2,$$

where an induced voltage generated by Nb turns of coils is equal to an induced voltage generated by the first winding, C is a real number greater than 0, and Nb, Ns, and B are positive numbers.

In actual application, due to a feature and a principle of a winding, quantities N, Nb, Ns, or B of turns of coils may be an integer, or may not be an integer. For example, the quantities of turns of coils may be 3, 1.5, or 2.4, but this embodiment of this disclosure is not limited thereto.

Figure 12:
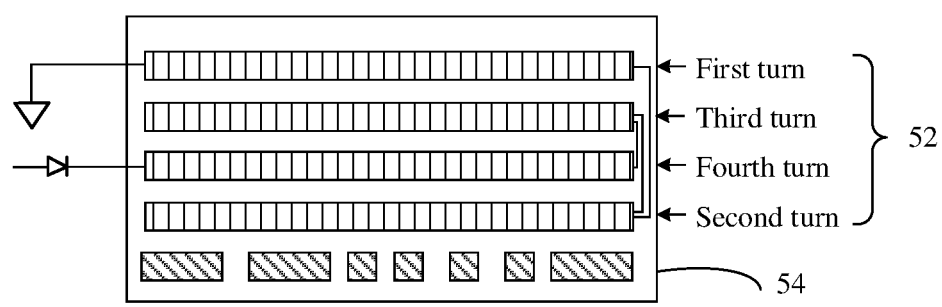
FIG. 12 shows an example of a secondary winding and a compensation winding according to an embodiment of this disclosure.
Figure 13:
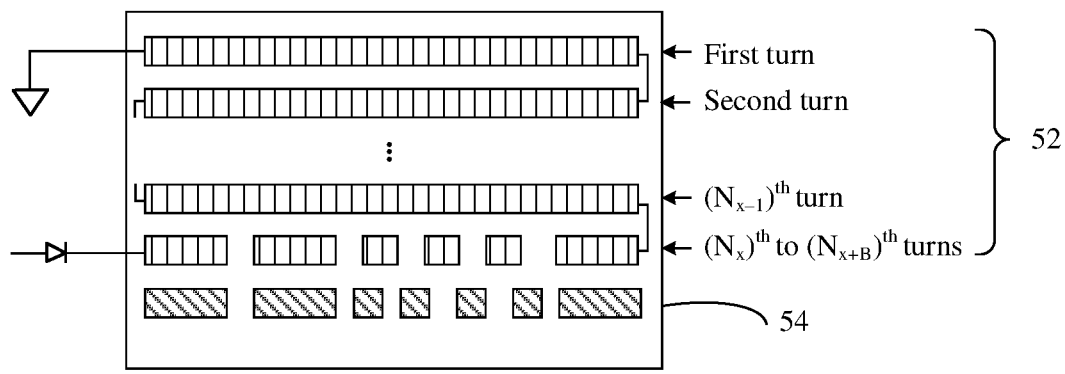
FIG. 13 shows another example of a secondary winding and a compensation winding according to an embodiment of this disclosure.

With reference to FIG. 12 and FIG. 13, the following uses an example in which the first winding layer is a secondary winding layer for describing an example of determining the quantity N of turns of the compensation winding in this embodiment of this disclosure. It should be understood that FIG. 12 and FIG. 13 are merely examples, but this embodiment of this disclosure is not limited thereto.

During operation of the transformer, the quantity of turns of the compensation winding 54 is related to Nb. When the compensation winding 54 includes Nb turns of coils, an average value of induced voltages generated by the Nb turns of coils is equal to an average value of induced voltages generated by the secondary winding.

In this embodiment of this disclosure, a value of Nb mainly depends on a voltage of the secondary winding 52 adjacent to the compensation winding 54.

FIG. 12 shows an example of the secondary winding 52 and the compensation winding 54 when the compensation winding 54 is adjacent to the secondary winding. As shown in FIG. 12, the secondary winding 52 includes four turns of coils and two terminals. One terminal connected to a circuit quiescent point of a secondary circuit is a first terminal, and the other terminal connected to a secondary rectifier diode is a second terminal. A coil disposed at a start position of the first terminal is defined as a first turn of coil. By analogy, subsequent coils are respectively a second turn of coil, a third turn of coil, and a fourth turn of coil.

In this embodiment of this disclosure, a turn of coil, adjacent to the compensation winding 54, of the secondary winding 52 is further defined as an $(N_x)^{th}$ turn of coil. For example, in FIG. 13, the compensation winding 54 is disposed adjacent to a second turn of coil of the secondary winding 52. In other words, in this case, $N_x=2$.

A theoretical value of the quantity of turns of the compensation winding for balancing an induced voltage generated by the secondary winding is Nb. In some embodiments, Nb may be determined according to the following formula:

$$Nb = 2 \times ((N_x + N_x - 1)/122)) = 2(N_x - 0.5) = 2N_x - 1 \qquad (1)$$

For example, when $N_x=2$, Nb=3.

FIG. 13 shows another example of the secondary winding 52 and the compensation winding 54. As shown in FIG. 13, the secondary winding 52 includes $N_{x+n}$ turns of coils and two terminals. One terminal connected to a circuit quiescent point of a secondary circuit is a first terminal, and the other terminal connected to a secondary rectifier diode is a second terminal. A coil disposed at a start position of the first terminal is defined as a first turn of coil. By analogy, subsequent coils are respectively a second turn of coil to an $(N_{x+n})^{th}$ turn of coil.

Optionally, a primary winding layer adjacent to the compensation winding 54 is not designed to include only one turn of coil, and the primary winding layer may alternatively include B turns of coils. For example, B may be a real number greater than 1. For example, in FIG. 13, the compensation winding 54 is disposed adjacent to an $(N_x)^{th}$ turn to an $(N_x+B-1)^{th}$ turn of coils of the secondary winding 52.

A theoretical value of the quantity of turns of the compensation winding for balancing an induced voltage generated by the secondary winding is Nb. In some embodiments, Nb may be determined according to the following formula:

$$Nb = 2 \times ((N_x + B - 1 + (N_x - 1))/122) = \qquad (2)$$
$$2(N_x + B/122 - 1) = 2N_x + B - 2$$

It should be noted that, in actual engineering design, restricted by space of a winding channel of a PCB winding, a quantity of turns of the winding is limited to some extent. Therefore, a turn of coil with a relatively small sequence number in the secondary winding may be preferentially arranged adjacent to the compensation winding. This can further reduce a value of Nb.

In some embodiments, C may be a real number greater than 0. In other words, N may be equal to Nb, or N may be greater than Nb or less than Nb. This is not limited in this embodiment of this disclosure.

In some optional embodiments, a winding direction of the shielding winding 53 is the same as a winding direction of the compensation winding 54, but this embodiment of this disclosure is not limited thereto.

Optionally, the secondary circuit includes a secondary rectifier diode and a secondary filter. When the secondary rectifier diode is connected to a negative electrode of a secondary filter capacitor, a first terminal of the compensation winding 54 and a first terminal of the primary winding 51 are non-dotted terminals. In this case, N may be greater than or equal to Nb.

In a possible case, when the primary winding 51 includes a primary power winding, a first terminal of the primary power winding is connected to an electric potential quiescent point of a primary circuit of a power conversion circuit, and the first terminal of the compensation winding 54 and the first terminal of the primary power winding are non-dotted terminals.

Figure 14:
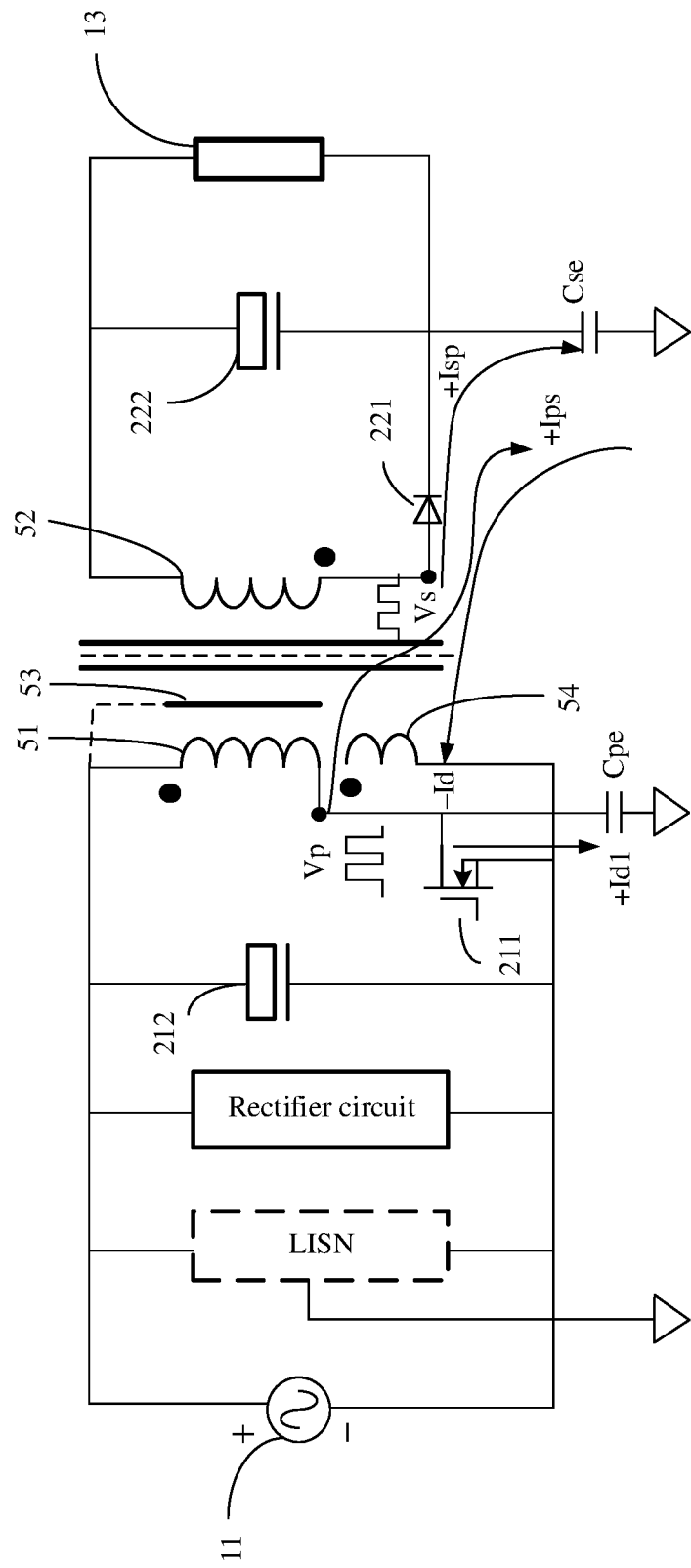
FIG. 14 is a schematic diagram of a common mode noise path in a power conversion circuit.

FIG. 14 is a schematic diagram of a common mode noise path in a power conversion circuit according to an embodiment of this disclosure. As shown in FIG. 14, a first terminal of a primary winding 51 may be connected to a primary filter capacitor 212, a second terminal of the primary winding 51 is connected to a primary switch transistor 211, and a voltage jump of the primary winding 51 may mean a jump voltage Vp generated during high-frequency switch-on or switch-off of the primary switch transistor 211. A first terminal of a secondary winding 52 may be connected to a secondary filter capacitor 222, and a second terminal of the secondary winding 52 is connected to a secondary switch transistor 221. A voltage jump of the secondary winding 52 may mean a jump voltage Vs generated during high-frequency switch-on or switch-off of the secondary switch transistor 221. The secondary rectifier diode 221 is connected to a negative electrode of the secondary filter capacitor 222. In addition, a first terminal of a shielding winding 53 may be connected to the primary filter capacitor 212, and a second terminal of the shielding winding 53 is unconnected; and a first terminal of a compensation winding 54 may be connected to the primary filter capacitor 212, and a second terminal of the compensation winding 54 is unconnected.

FIG. 14 shows possible common mode noise paths based on a flyback converter when a planar transformer does not include a shield winding. A first common mode noise path is a noise current +Ips that is formed by coupling a jump voltage Vp of a primary circuit to the secondary winding and that flows to the ground. A second common mode noise path is a noise current +Isp that is formed by a jump voltage Vs of a secondary circuit and that flows to the ground. A third common mode noise path is an induced current −Id that is formed by the compensation winding and that flows to the primary winding. A fourth common mode noise path is a noise current that is formed in another noise path in the flyback converter system and that flows to the ground, for example, is +Id1 that is formed by directly coupling the jump voltage Vp to an LISN through a space coupling capacitor Cpe.

Figure 15:
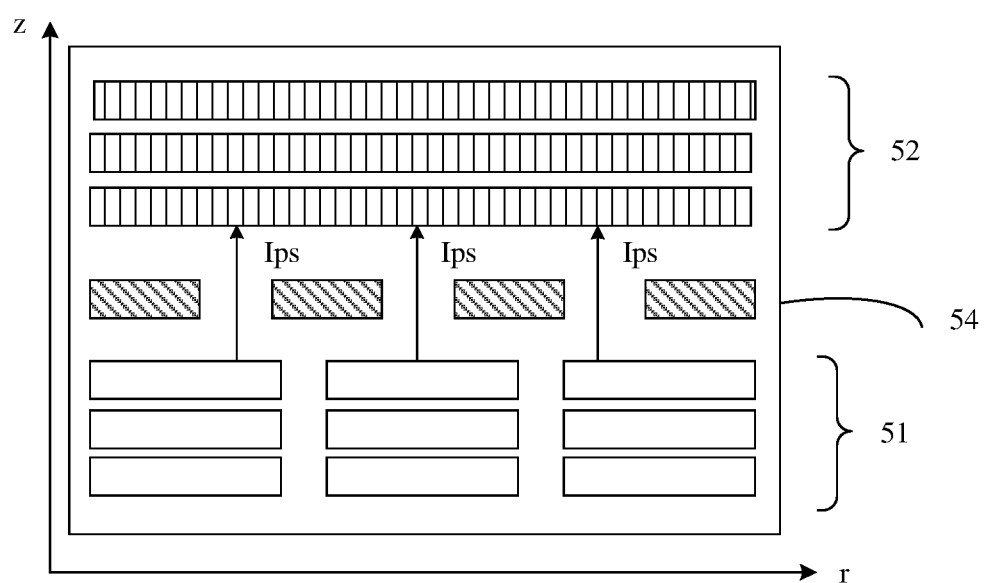
FIG. 15 is a schematic diagram of a common mode noise path in a planar transformer.

As shown in FIG. 15, when a planar transformer includes a compensation winding but does not include a shielding winding, a noise current Ips may include a noise current formed by coupling a potential jump Vp of a primary winding to a secondary winding through an inter-turn gap of the compensation winding, or include a noise current formed by directly coupling the potential jump Vp of the primary winding to the secondary winding. When the planar transformer includes the compensation winding and a shielding winding, the shielding winding can reduce or even eliminate a noise current that is formed by coupling a jump voltage Vp of a primary circuit to the secondary winding and that flows to the ground.

As shown in FIG. 14, in a case in which the planar transformer in this embodiment of this disclosure includes the compensation winding and the shielding winding, the compensation winding needs to cancel at least a noise current (Isp+Id1). The noise current that needs to be canceled by the compensation winding is greater than a common mode noise current generated by the secondary winding. Therefore, positive compensation may be performed on the quantity Nb of turns of coils, to further obtain a quantity N of turns of coils of the compensation winding 54.

For example, N may satisfy the following condition:

$$N = Nb \times C1 \qquad (3)$$

where C1 is a real number greater than 1.

In some optional embodiments, as shown in FIG. 14, when the planar transformer is provided with the shielding winding, if Id=Isp (it is assumed that the shielding winding can completely eliminate Ips), common mode noise of the transformer itself can be canceled. Because the shielding winding can reduce or even eliminate the noise current Isp that is formed by coupling the jump voltage Vp of the primary circuit to the secondary winding and that flows to the ground, the shielding winding can be disposed to reduce a value of C1, that is, reduce the quantity of turns of the compensation winding.

Further, from a perspective of the entire flyback converter system, to implement minimum common mode noise of the system, Isp+Id1−Id=0 needs to be satisfied. In other words, in addition to cancellation of the common mode noise of the transformer itself, cancellation of Id1 also needs to be considered. Therefore, to cancel the common mode noise of the flyback converter system, C1 may be determined based on a noise current that is formed by coupling a potential jump of the primary winding to the line impedance stabilization network LISN through the space coupling capacitor.

Optionally, C1 may be determined based on a process tolerance of a PCB. The process tolerance may include at least one of an interlayer dielectric thickness tolerance, a line width tolerance of the compensation winding, a dielectric constant tolerance of a PCB board, and the like.

For example, during cancellation of the common mode noise of the transformer, in consideration of the shielding winding and/or the process tolerance of the PCB, a value range of C1 may be set to 1.3-1.8. For example, a corrected N-correction may be shown in the following formula (4):

$$N\text{-correction} = [(Nb \times 1.3), (Nb \times 1.8)] \quad (4)$$

Correspondingly, Formula (1) may be substituted into Formula (4), to obtain a value of the corrected N-correction as follows:

$$N\text{-correction} = [2.6(N_x - 0.5), 3.6(N_x - 0.5)] \quad (5)$$

For example, when a value of $N_x$ is 2, N-correction=[43.9, 5.4].

Correspondingly, Formula (2) may be substituted into Formula (4), to obtain a value of the corrected N-correction as follows:

$$N\text{-correction} = [2.6(N_x + B/122 - 1), 3.6(N_x + B/122 - 1)] \quad (6)$$

For example, when cancellation of Id1 also needs to be considered in addition to cancellation of the common mode noise of the transformer itself, and when a noise current that is formed by coupling a potential jump of a primary power winding to the line impedance stabilization network LISN through the space coupling capacitor is considered, due to uncertainty of the space coupling capacitor Cpe, C1 can be further compensated to 120% of 1.3-1.8, that is, [1.3×1.2-1.8×1.2]. In other words, a value range of C1 is 1.56-2.16. For example, a corrected N-correction may be shown in the following formula (7):

$$N\text{-correction} = [(Nb \times 1.56), (Nb \times 2.16)] \quad (7)$$

Correspondingly, Formula (1) may be substituted into Formula (7), to obtain a value of the corrected N-correction as follows:

$$N\text{-correction} = [3.12(N_x - 0.5), 4.32(N_x - 0.5)] \quad (8)$$

For example, when a value of $N_x$ is 2, N-correction=[4.68, 6.48].

Correspondingly, Formula (2) is substituted into Formula (7), and a value of the corrected N-correction is as follows:

$$N\text{-correction} = [3.12(N_x + B/122 - 1), 4.32(N_x + B/122 - 1)] \quad (9)$$

Optionally, the secondary circuit includes a secondary rectifier diode and a secondary filter capacitor. When the secondary rectifier diode is connected to a positive electrode of the secondary filter capacitor, a first terminal of the compensation winding 54 and a first terminal of the primary winding 51 are dotted terminals. In this case, N may be less than or equal to Nb.

In a possible case, when the primary winding 51 includes a primary power winding, a first terminal of the primary power winding is connected to an electric potential quiescent point of a primary circuit of a power conversion circuit, and the first terminal of the compensation winding 54 and the first terminal of the primary power winding are dotted terminals.

Figure 16:
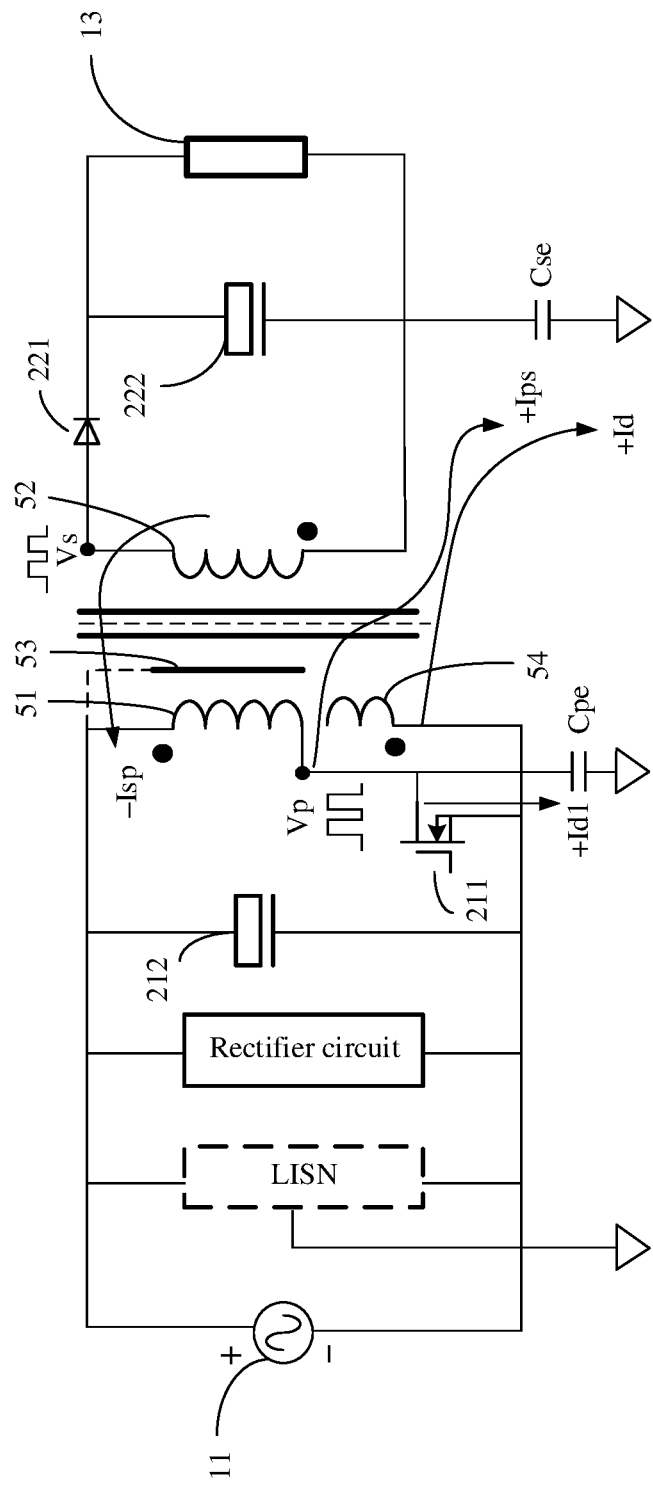
FIG. 16 is a schematic diagram of a common mode noise path in a power conversion circuit.

FIG. 16 is a schematic diagram of a common mode noise path in a power conversion circuit according to an embodiment of this disclosure. As shown in FIG. 16, a first terminal of a primary winding 51 may be connected to a primary filter capacitor 212, a second terminal of the primary winding 51 is connected to a primary switch transistor 211, and a voltage jump of the primary winding 51 may mean a jump voltage Vp generated during high-frequency switch-on or switch-off of the primary switch transistor 211. A first terminal of a secondary winding 52 may be connected to a secondary filter capacitor 222, and a second terminal of the secondary winding 52 is connected to a secondary switch transistor 221. A voltage jump of the secondary winding 52 may mean a jump voltage Vs generated during high-frequency switch-on or switch-off of the secondary switch transistor 221. The secondary rectifier diode 221 is connected to a positive electrode of the secondary filter capacitor 222. In addition, a first terminal of a shielding winding 53 may be connected to the primary filter capacitor 212, and a second terminal of the shielding winding 53 is unconnected; and a first terminal of a compensation winding 54 may be connected to the primary filter capacitor 212, and a second terminal of the compensation winding 54 is unconnected.

FIG. 16 shows possible common mode noise paths based on a flyback converter when a planar transformer does not include a shield winding. A first common mode noise path is a noise current +Idps that is formed by coupling a jump voltage Vp of a primary circuit to the secondary winding and that flows to the ground. A second common mode noise path is a noise current −Isp that is formed by a jump voltage Vs in a secondary circuit and that flows to the primary winding. A third common mode noise path is an induced current +Id that is formed by the compensation winding and that flows to the secondary winding. A fourth common mode noise path is a noise current that is formed in another noise path in the flyback converter system and that flows to the ground, for example, is +Id1 that is formed by directly coupling the jump voltage Vp to an LISN through a space coupling capacitor Cpe.

When the planar transformer includes the compensation winding and does not include a shielding winding, a noise current +Ips may include a noise current formed by coupling the jump voltage Vp of the primary circuit to the secondary winding through an inter-turn gap of the compensation winding, or include a noise current formed by directly coupling a potential jump Vp of the primary winding to the secondary winding. When the planar transformer includes the compensation winding and a shielding winding, the shielding winding can reduce or even eliminate a noise current that is formed by coupling the jump voltage Vp of the primary circuit to the secondary winding and that flows to the ground.

As shown in FIG. 16, in a case in which the planar transformer in this embodiment of this disclosure includes the compensation winding and the shielding winding, the compensation winding needs to cancel at least a noise current (Isp−Id1). The noise current that needs to be canceled by the compensation winding is less than common mode noise generated by the secondary winding. Therefore, negative compensation may be performed on the quantity Nb of turns of coils, to further obtain a quantity N of turns of coils of the compensation winding 54.

For example, N may satisfy the following condition:

$$N = Nb \times C2 \qquad (10)$$

where C2 is a real number within a value range [0, 1].

Based on a principle similar to that in the foregoing embodiment, because the shielding winding can reduce or even eliminate the noise current Id1 that is formed by coupling the jump voltage Vp of the primary circuit to the secondary winding and that flows to the ground, the shielding winding can be disposed to reduce a value of C2, that is, reduce the quantity of turns of the compensation winding. Further, when cancellation of Id2 needs to be considered, C2 may be determined based on a noise current that is formed by coupling a potential jump of the primary winding to the line impedance stabilization network LISN through the space coupling capacitor.

Optionally, C2 may be determined based on a process tolerance of a PCB. The process tolerance may include at least one of an interlayer dielectric thickness tolerance, a line width tolerance of the compensation winding, a dielectric constant tolerance of a PCB board, and the like.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this disclosure, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this disclosure essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of this disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

The invention claimed is:

1. A planar transformer, comprising a magnetic core and a printed circuit board (PCB) winding board, wherein the PCB winding board comprises:

a primary winding, wherein a first terminal of the primary winding is connected to an electric potential quiescent point of a primary circuit of a power conversion circuit, and a first turn of coil of the primary winding is disposed at a start position of the first terminal of the primary winding;

a secondary winding, wherein a first terminal of the secondary winding is connected to an electric potential quiescent point of a secondary circuit of the power conversion circuit, and a first turn of coil of the secondary winding is disposed at a start position of the first terminal of the secondary winding;

a shielding winding, disposed between the primary winding and the secondary winding, and configured to shield electric field coupling between the primary winding and the secondary winding; and a compensation winding, adjacent to the primary winding or adjacent to the secondary winding, wherein the compensation winding comprises N turns of coils, and N is a positive number greater than 1 wherein the compensation winding is adjacent to a first winding layer in a first winding: the first winding is the primary winding adjacent to the compensation winding or the secondary winding adjacent to the compensation winding; and an $(Ns)^{th}$ turn to an $(Ns+B-1)^{th}$ turn of coils of the first winding are disposed at the first winding layer, wherein N satisfies the following condition:

N=Nb×C, and Nb=2×Ns+B−2, wherein an induced voltage generated by Nb turns of coils is equal to an induced voltage generated by the first winding, C is a real number greater than 0, and Nb, Ns, and B are positive numbers.

2. The planar transformer according to claim 1, wherein the shielding winding is adjacent to the primary winding or adjacent to the secondary winding.

3. The planar transformer according to claim 1, wherein a projection of the primary winding on a first plane along a z axis and/or a projection of the secondary winding on the first plane along the z axis and/is located in a projection of the shielding winding on the first plane along the z axis, the first plane is a plane on which a surface of the PCB winding board is located, and the z axis is perpendicular to the first plane.

4. The planar transformer according to claim 1, wherein the compensation winding is adjacent to the secondary winding, and a first terminal of the compensation winding is connected to the electric potential quiescent point of the primary circuit.

5. The planar transformer according to claim 1, wherein the compensation winding is adjacent to the primary winding, and a first terminal of the compensation winding is connected to the electric potential quiescent point of the secondary circuit.

6. The planar transformer according to claim 4, wherein the secondary circuit comprises a secondary rectifier diode and a secondary filter capacitor, and when the secondary rectifier diode is connected to a negative electrode of the secondary filter capacitor, the first terminal of the compensation winding and the first terminal of the primary winding are non-dotted terminals.

7. The planar transformer according to claim 4, wherein the secondary circuit comprises a secondary rectifier diode and a secondary filter capacitor, and when the secondary rectifier diode is connected to a positive electrode of the secondary filter capacitor, the first terminal of the compensation winding and the first terminal of the primary winding are dotted terminals.

8. The planar transformer according to claim 1, wherein a value range of C is [1.56, 2.16] or (0, 1].

9. The planar transformer according to claim 1, wherein a second terminal of the compensation winding is unconnected.

10. The planar transformer according to claim 1, wherein the electric potential quiescent point of the primary circuit comprises a point that is in the primary circuit and that is connected to a positive electrode of a bus capacitor or connected to a primary working ground network, and the electric potential quiescent point of the secondary circuit comprises a point that is in the secondary circuit and that is connected to a positive electrode of a secondary output filter capacitor or connected to a secondary working ground network, wherein a voltage of the electric potential quiescent point does not jump in a circuit operational process.

11. The planar transformer according to claim 1, wherein a first terminal of the shielding winding is connected to the electric potential quiescent point of the primary circuit or an electric potential quiescent point of the secondary winding, and a second terminal of the shielding winding is unconnected.

12. A power conversion circuit, comprising the planar transformer, the primary circuit, and the secondary circuit according to claim 1, wherein the planar transformer is disposed between the primary circuit and the secondary circuit.

13. An adapter, comprising the power conversion circuit according to claim 12.

14. The planar transformer according to claim 1, further comprising another shielding winding, wherein the shielding winding is adjacent to both the primary winding and the secondary winding, and the other shielding winding is adjacent to the primary winding and the compensation winding.

15. The planar transformer according to claim 1, further comprising another shielding winding, wherein the shielding winding is adjacent to both the primary winding and the secondary winding, and the other shielding winding is adjacent to the secondary winding and the compensation winding.

16. The planar transformer according to claim 1, wherein:
the secondary circuit includes a secondary rectifier diode and a secondary filter capacitor,
the secondary rectifier diode is connected to a negative electrode of the secondary filter capacitor, and a first terminal of the compensation winding and the first terminal of the primary winding are non-dotted terminals, and
a value of C is greater than 1.

17. The planar transformer according to claim 1, wherein:
the secondary circuit includes a secondary rectifier diode and a secondary filter capacitor,
the secondary rectifier diode is connected to a positive electrode of the secondary filter capacitor, and the first terminal of the compensation winding and the first terminal of the primary winding are non-dotted terminals, and
the value range of C is (0, 1].

* * * * *